United States Patent [19]
Nakano et al.

[11] Patent Number: 5,404,315
[45] Date of Patent: Apr. 4, 1995

[54] AUTOMATIC SOUND GAIN CONTROL DEVICE AND A SOUND RECORDING/REPRODUCING DEVICE INCLUDING ARITHMETIC PROCESSOR CONDUCTING A NON-LINEAR CONVERSION

[75] Inventors: Takahiko Nakano, Ikoma; Shuichi Yoshikawa, Nara, both of Japan

[73] Assignee: Sharp Kabushiki Kaisha, Osaka, Japan

[21] Appl. No.: 875,156

[22] Filed: Apr. 30, 1992

[30] Foreign Application Priority Data

| Apr. 30, 1991 | [JP] | Japan | 3-098541 |
| May 22, 1991 | [JP] | Japan | 3-117384 |
| May 23, 1991 | [JP] | Japan | 3-118775 |

[51] Int. Cl.⁶ .................. H03G 5/00; H03G 7/00
[52] U.S. Cl. .................. 364/514; 381/102; 381/106; 381/107; 381/122; 327/331
[58] Field of Search .......... 381/98, 101, 102, 122, 381/107, 106; 364/514; 379/88, 89; 333/17.2; 307/490, 493

[56] References Cited

U.S. PATENT DOCUMENTS

| 4,631,749 | 12/1986 | Rapaich | 381/101 X |
| 4,805,217 | 2/1989 | Morihiro et al. | 381/35 OR |
| 4,862,270 | 8/1989 | Nishio | 358/160 OR |
| 5,165,017 | 11/1992 | Eddington et al. | 381/68.4 OR |
| 5,210,806 | 5/1993 | Kihara et al. | 381/102 X |

FOREIGN PATENT DOCUMENTS

| 59-44684 | 3/1984 | Japan . |
| 64-40998 | 2/1989 | Japan . |

Primary Examiner—Emanuel T. Voeltz
Assistant Examiner—Kamini S. Shah
Attorney, Agent, or Firm—Nixon & Vanderhye

[57] ABSTRACT

A sound gain control device for automatically controlling a gain by which an output signal from a sound CODEC is multiplied is provided. Sound signals from a sound input device are processed by a non-linear conversion circuit so that the sound signals with small amplitudes are enlarged by extending the amplitudes and the time axis thereof, thereby to average the incidence probabilities of amplitudes. Then, a proper amplitude for a gain control is calculated based on the averaged signals by an amplitude calculating circuit, and a gain corresponding to the calculated amplitude is determined by a gain determining circuit and sent as a amplitude coefficient to a multiplier to which the sound signals from the sound input device are input through a sound CODEC.

8 Claims, 6 Drawing Sheets

AUTOMATIC SOUND GAIN CONTROL DEVICE AND A SOUND RECORDING/REPRODUCING DEVICE INCLUDING ARITHMETIC PROCESSOR CONDUCTING A NON-LINEAR CONVERSION

BACKGROUND OF THE INVENTION

1. Field of the Invention

The present invention relates to an automatic gain control device used for a sound CODEC (CODEC is a compound word of a coder and a decoder). More particularly, the present invention relates to an automatic sound gain control device for automatically adjusting gains of sound signals input from a sound input device, such as a microphone, to proper values, and a sound recording/reproducing device provided with such an automatic sound gain control device.

2. Description of the Prior Art

The sound CODEC is a device which has two functions of coding sound which is an analog signal and decoding the coded data. Using such a sound CODEC, a conventional sound recording/reproducing device converts analog sound signals into coded data and records the coded data on a recording medium such as a tape cartridge.

Some of the telephones having the answering function employ a sound recording/reproducing device using a semiconductor memory instead of a magnetic tape. In such a sound recording/reproducing device, data coded from sound signals are stored in the memory and then decoded to be reproduced as sound.

In order to improve the quality of sound reproduced, a gain of a sound signal must be adjusted to a proper value by a sound gain control device so that the amplitude of the sound signal can be corrected to a proper size. Conventionally, this gain control has been accomplished by a feedback control in which an averaged value of sound amplitudes or sound power obtained by monitoring sound signals is fed back as a gain coefficient. One method of sampling the characteristics of the sound signals is based on a frequency distribution obtained by a statistical technique.

However, when the sound signals are monitored for a long period of time, the frequency distribution is not uniform, with the sound signals of smaller amplitudes having a larger incidence probability and the sound signals of larger amplitudes having a smaller incidence probability. Therefore, the frequency distribution method fails to seize the characteristics of the sound precisely and thus to provide a precise amplitude coefficient. As a result, the sound quality is deteriorated. Especially, when a short speech is included during that long period of time, the sound can not be specified and thus information of a proper amplitude can not be obtained, thereby causing a serious problem. In addition, in the case of a speech, there is another problem of being affected by the intonation of the speech.

When the gain control is performed by successively feeding back to adjust a gain depending on the size of a sound signal, the sound obtained will lack in intonation and be monotonous. However, in a sound recording/reproducing device employed in the telephone with the answering function, which has a time lag between the recording of sound signals and the reproduction thereof, it is possible to determine how to adjust the gains afterwards. Making the best use of this advantage, a sound gain control device has been developed in which sound signals are sampled in each prescribed period, and an adjusting value of gain is calculated based on the average of amplitudes of the sound signals in each prescribed period and is recorded together with digital data of the sound signals. In this way, by performing the gain control of sound signals in each period, the intonation and other characteristics of the sound can be preserved.

A usual speech includes a sounding portion where a speech is generated and a silent portion between the punctuations of the speech. In a speech having many silent portions, the rate of the silent portions occupying the period is increased, whereby the average of the amplitudes of the sound signals is abnormally lowered. Therefore, in the conventional sound gain control device, when the gain is adjusted in a block of sound signals in each prescribed period, a proper gain adjustment for the sound having many silent portions is not possible. The period may be shortened, but this will produce the sound with poor intonation as in the case of the above-described successive feedback method, and will not solve the problem.

Further, in the conventional sound recording/reproducing device, since the sound signals are adjusted with the gains and coded before they are stored in a recording medium, the sound signals after the gain adjustment are decoded for reproduction. For this reason, in the conventional sound recording/reproducing device, the scale and intonation of the reproduced sound become monotonous, and therefore, the nuance of the recorded message can not be conveyed precisely.

SUMMARY OF THE INVENTION

The sound gain control device of the invention is for automatically controlling a gain by which an output signal from a sound CODEC is multiplied, and which overcomes the above-discussed and numerous other disadvantages and deficiencies of the prior art, comprises a non-linear conversion means for receiving sound signals from a sound input device and non-linearly converting the sound signals; an amplitude calculating means for receiving the non-linearly converted sound signals and calculating an amplitude of the non-linearly converted sound signals; and a gain determining means for determining a gain based on the calculated amplitude of the non-linearly converted sound signals.

In a preferred embodiment, the device further comprising a digital signal processor having an arithmetic processor, the arithmetic processor conducting a non-linear conversion according to a software program in the digital signal processor.

In a preferred embodiment, the non-linear conversion is conducted by a $\mu$ law compression characteristic method which is one of non-linear quantization methods.

According to the present invention, a sound gain control device for automatically controlling a gain by which an output signal from a sound CODEC is multiplied is provided, the device comprising: a frequency distribution producing means for producing a first frequency distribution of amplitudes of sound signals in each prescribed period; a sounding section sampling means for sampling only sounding sections of the sound signals out of the first frequency distribution, and for producing a second frequency distribution of amplitudes of the sound signals; an average calculating means for calculating an average of amplitudes of the sound signals based on the second frequency distribution; and a gain determining means for determining the gain based on the calculated average of the amplitudes of the sound signals.

According to the present invention, a sound recording/reproducing device is provided, the device comprising; a coding means for coding the sound signals; a memory means for recording the coded sound signals; a decoding means for reading the coded sound signals from the memory means and decoding the coded sound signal; an average calculating means for calculating an average of amplitudes of the sound signals in each period; a gain coefficient calculating means for calculating a gain coefficient based on the calculated average of amplitudes of the sound signals and recording the gain coefficient to the memory means; and a gain control means for reading the gain coefficient from the memory means and adjusting gain based on the gain coefficient.

One objective of the present invention is to provide a sound gain control device capable of performing a precise gain control without being affected by noises and intonation included in sound signals.

Another objective of the present invention is to provide a sound gain control device capable of performing a gain control without being affected by silent portions of the sound signals by producing a frequency distribution of amplitudes of sound signals in each prescribed period and sampling only sounding portions of the sound signals from the frequency distribution to calculate an average thereof.

Yet another objective of the present invention is to provide a sound recording/reproducing device capable of reproducing sound signals preserving the size and intonation of the original sound, while minimizing the increase of recording data, by performing a gain control for every prescribed period and recording a gain coefficient for the gain control separately from digital data of the sound signals.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Example 1

Figure 1:
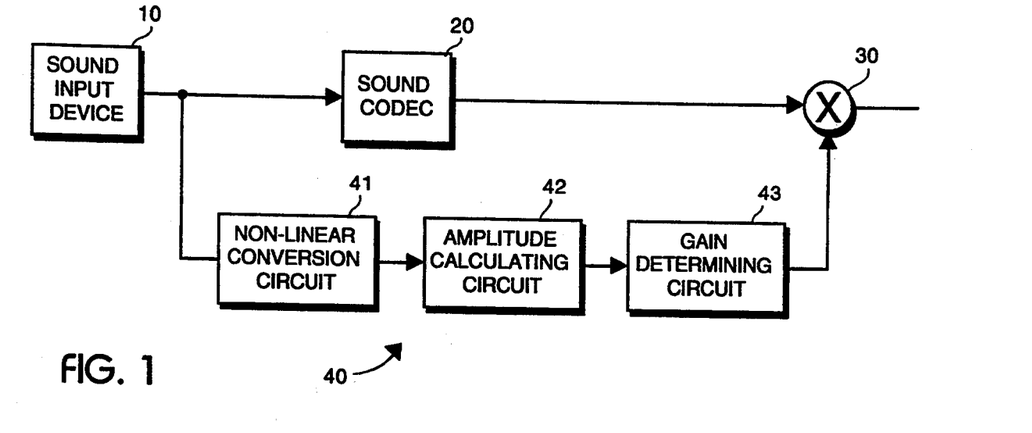
FIG. 1 is a block diagram of a sound gain control device according to the present invention used for a system of a sound recording/reproducing device provided with a sound CODEC.

FIG. 1 is a block diagram of a sound gain control device of the present invention used for a system of a sound recording/reproducing device provided with a sound CODEC.

Referring to FIG. 1, a sound input device 10 monitors a series of sound signals and samples the amplitudes of the series of sound signals at a prescribed pitch. The sampled signals are input into a sound CODEC 20, where the input signals are coded and then the coded data are decoded to be sent to a multiplier 30. More specifically, the data coded by a coding circuit of the sound CODEC 20 are sent to a recording portion of the recording/reproducing device and then recorded in a recording medium (not shown) such as a tape cartridge. In this way, a speech, for example, is recorded. The coded data read from the recording medium are then decoded by a decoding circuit of the sound CODEC 20 before being sent to the multiplier 30.

The multiplier 30 also receives a gain coefficient determined by a sound gain control device 40, and outputs a signal obtained by multiplying the decoded signal by the gain coefficient, i.e., a signal with a proper amplitude after the gain control.

The sound gain control device 40 comprises a non-linear conversion circuit 41 receiving the sound signals sampled by the sound input device 10, an amplitude calculating circuit 42 receiving the sound signals processed by the non-linear conversion circuit 41, and a gain determining circuit 43 for calculating the gain coefficient based on the amplitude for gain control calculated by the amplitude calculating circuit 42.

In the non-linear conversion circuit 41, the input sound signals are non-linearly converted; that is, the amplitude and the time axis of a signal with a smaller amplitude among the sound signals are enlarged. In this way, the incidence probabilities of signals with smaller amplitudes and signals with larger amplitudes are averaged. Therefore, when the thus averaged sound signals are statistically processed, a uniform frequency distribution can be obtained. In addition, by this averaging, noises with large amplitudes included in the sound signals are compressed, thereby eliminating the influence of the noises. As a result, a proper gain control based on the averaged sound signal is possible with reduced influence of noises and intonation.

The amplitude calculating circuit 42 calculates an amplitude required for the gain control based on the amplitudes of sound signals of which incident probabilities have been averaged by the non-linear conversion circuit 41. Various methods for calculating the amplitude are known; for example, a maximum value of amplitudes of the sound signals sampled in each prescribed period from those successively sent from the non-linear conversion circuit 41 is calculated, and the obtained maximum value is set to be an "amplitude" for the sound signals in the prescribed period; or an average amplitude is calculated based on the frequency distribution of amplitudes in each prescribed period, and the obtained average amplitude is set to be an "amplitude" for the sound signals in the prescribed period.

The data of the calculated amplitude are sent to a gain determining circuit 43, where a gain corresponding to the calculated amplitude is calculated to be output to the multiplier 30.

In parallel with the amplitude calculation required for the gain control as described above, the sound CODEC 20 codes the sound signals. In short, according to this example, the gain determining process is performed in parallel with the coding process so as not to affect the sound quality during the processing in the sound CODEC 20.

The sound gain control device 40 of the present invention comprising the non-linear conversion circuit 41, the amplitude calculating circuit 42 and the gain determining circuit 43 can be realized by analog circuits. However, the sound gain control device 40 can be constituted of a DSP (digital signal processor) which realizes the arithmetic processing performed by the non-linear conversion circuit 41, the amplitude calculating circuit 42, and the gain determining circuit 43 by a software program. According to this system, the arithmetic processing can be performed in a swift and precise way, as described below in detail.

Figure 2:
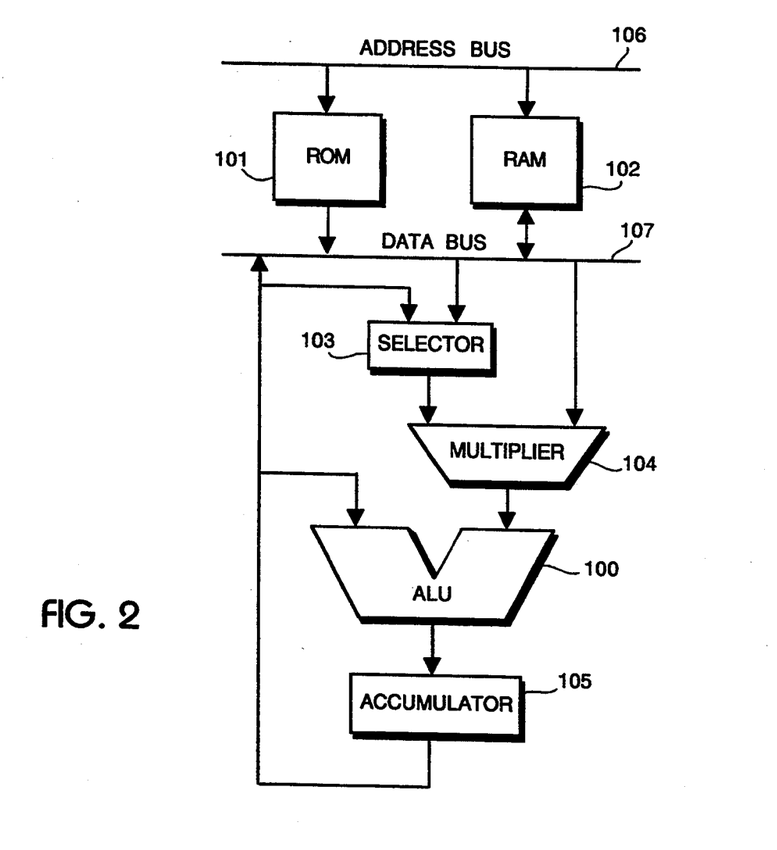
FIG. 2 shows a structure of a digital signal processor used in an embodiment according to the present invention.

FIG. 2 shows a system structure of the DSP. The DSP comprises a multiplier 104 for processing multiplication and addition frequently performed during the digital signal processing. The multiplication by the multiplier 104 is performed in such a manner that each digit (bit) of a multiplier is multiplied by a multiplicand (AND operation) to obtain each partial product and all of the partial products are added to obtain a final product. The multiplier 104 conducts a parallel operation of the multiplication to obtain the partial products and the addition to obtain the final product so as to realize a high-speed processing.

The DSP involves a number of arithmetic processes of multiplication and addition in the form of accumulating the results of multiplication. For this reason, the arithmetic circuit of the DSP, i.e., an ALU (arithmetic logic unit) 100, is designed so that the result of multiplication performed by the multiplier 104 can be successively accumulated at each cycle. More specifically, each result of the multiplication by the multiplier 104 can be directly input to the ALU 100. Also, the result obtained by the arithmetic processing by the ALU 100 is stored in an accumulator 105 which is a register for accumulation, and in return, the output of the accumulator 105 is supplied to the ALU 100. The output of the accumulator 105 is also supplied to the multiplier 104 through a selector 103.

AS described above, the DSP can effect the multiplication and addition at a high speed. To accomplish the high-speed operation, however, the ALU 100 must be supplied with data in succession in order to maximize the processing capacity of the ALU 100 and thereby to increase the throughput of the ALU 100. For this purpose, the DSP is provided with a plurality of data buses 107 (only one data bus is shown in FIG. 2).

In a ROM 101 and a RAM 102, data are written to or read from a corresponding address therein according to an address accompanying the data sent through an address bus 106. The data bus 107 shown in FIG. 2 functions as a bus connecting the outputs of the ROM 101 and the RAM 102 and input registers of the multiplier 104. That is, the data bus 107 is a bus for setting a multiplier and a multiplicand every cycle for the multiplier 104 every cycle by the data bus 107. Through the data bus 107, data are successively read from the ROM 101 and the RAM 102.

Next, referring to FIGS. 3 and 4, the non-linear conversion processing by the ALU 100 will be described. The non-linear conversion processing is same as the processing performed by the non-linear conversion circuit 41. In this case, the ALU 100 executes an algorithm according to a program for the non-linear conversion processing stored in the ROM 101. More specifically, the non-linear conversion processing is performed in accordance with a $\mu$ compression characteristic method which is one of quantization methods. In this non-linear conversion processing, the following transformation formula (1) is calculated to obtain y (a signal level after compression) as a uniform frequency distribution attained by averaging input levels from the sound input device 10.

$$y = (x-a)(16/b) + c \qquad (1)$$

wherein x is a signal level before compression (an input level from the sound input device 10), and a, b and c are coefficients corresponding to the properties of the sound input device 10.

Figure 3:
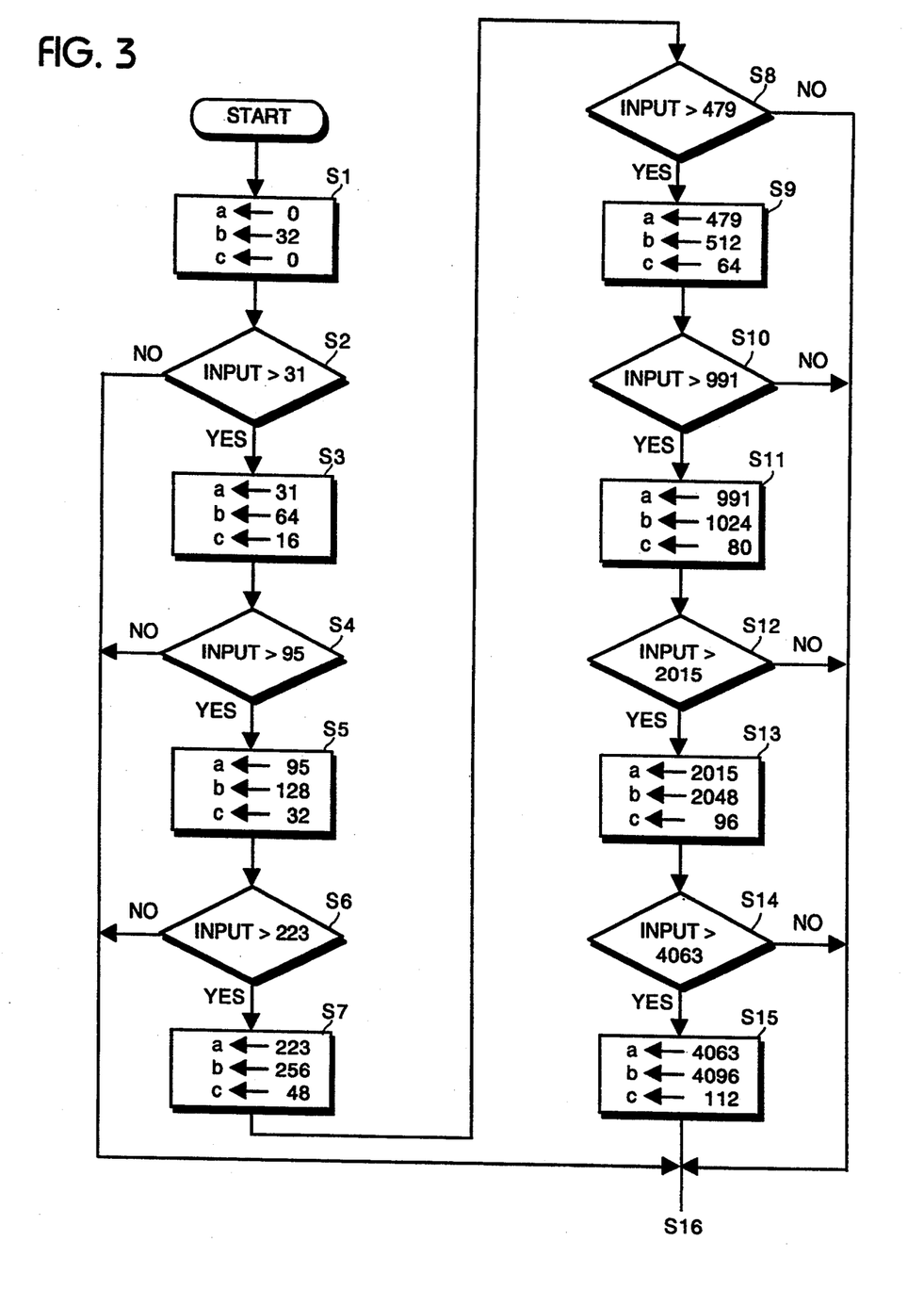
FIG. 3 is a flowchart showing a part of the converting operation of a non-linear conversion circuit of the sound gain control device according to the present invention.
Figure 4:
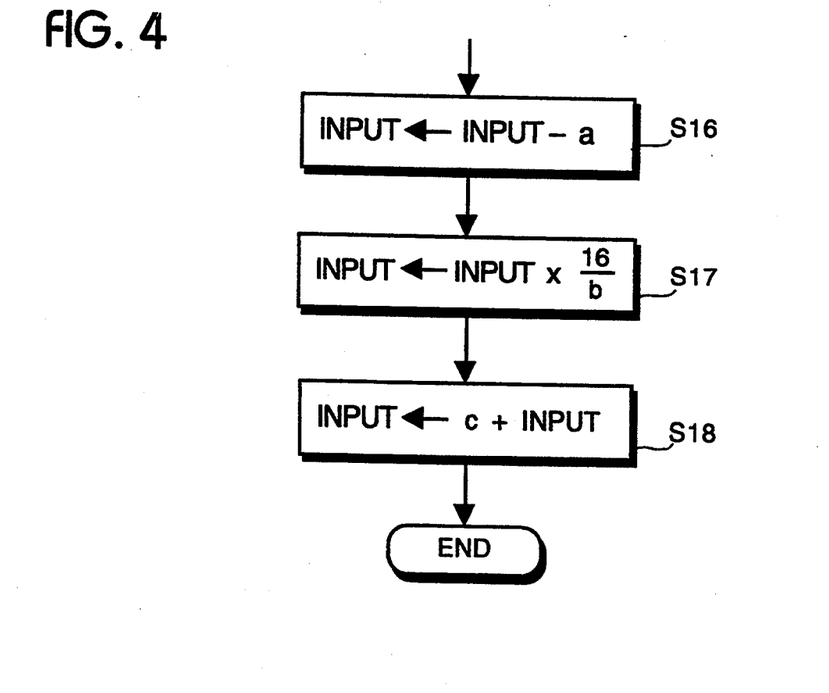
FIG. 4 is a flowchart showing the remaining part of the converting operation shown in FIG. 3.
Figure 5:
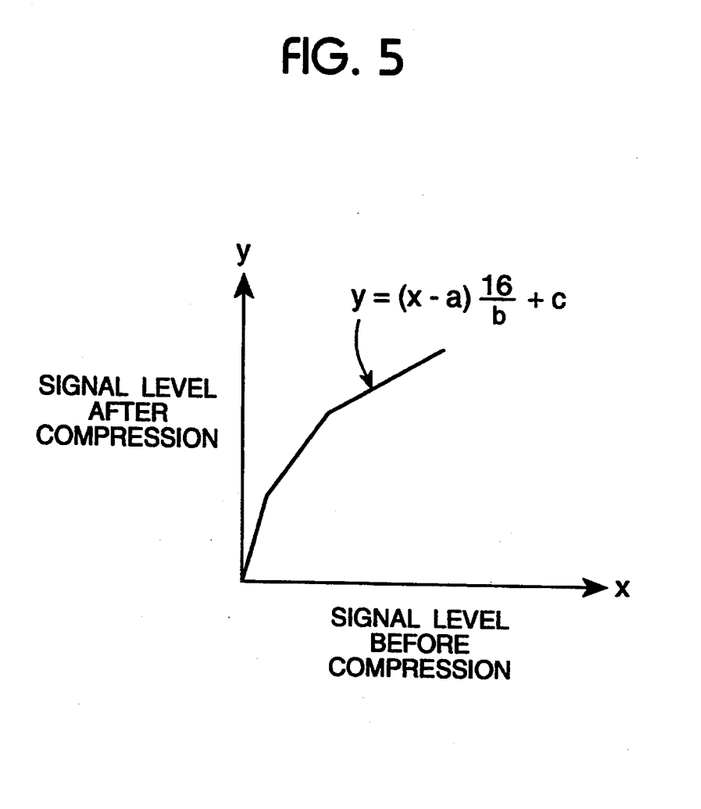
FIG. 5 is a graph showing the converting relationship of the non-linear conversion conducted in the non-linear conversion circuit.

Referring to FIGS. 3 and 4, the procedure of calculating y will be described in detail. First, when this program starts, at step S1, the ALU 100 sets 0, 32, and 0 for the coefficients a, b, and c, respectively, for accomplishing the above formula (1). Then, at step S2, whether the value of the input level x is larger than 31 is judged. When it is not larger than 31, the program proceeds to step S16 shown in FIG. 4, where the input level −a is set for the input level x; that is, (x−a) in the above formula (1) is calculated at step S16.

When the input level x is larger than 31, the input level x is not set, but 31, 64, 16 are set for the coefficients a, b, and c, respectively, at step S3. Then, at step S4, whether the value of the input level x is larger than 95 is judged. When it is not larger than 95, the program proceeds to step S16 where the input level x at this time −a is set for the input level x.

When the input level x is larger than 95, then, 95, 128, 32 are set for the coefficients a, b and c, respectively, at step S5. Then, at step S6, whether the value of the input level x is larger than 223 is judged. When it is not larger than 223, the program proceeds to step S16, where the same processing for setting the input level x is performed. When it is larger than 223, new values are set for the coefficients a, b, and c. Likewise, the processing at steps S7 through S15 are performed, finally to proceed to step S16, where the input level −a is set for the input level x; that is, (x−a) in the above formula (1) is calculated at step S16.

After the input level x is set, at step S16, the ALU 100 orders the multiplier 104 to perform an arithmetic processing of multiplying the input level (x−a) calculated at the arithmetic step S16 by (16/b) at step S17. The result of the above processing, that is, (x−a)×(16/b) in formula (1) is accumulated in the accumulator 105 as a new input level.

Subsequently, at step S18, the input level (x−a)×(16/b) accumulated in the accumulator 105 is read out so that the multiplier 104 can perform the addition of the coefficient c to (x−a)×(16/b). The resultant value (x−a)×(16/b)+c is obtained as the final input level, i.e., the signal level y after conversion, which is accumulated in the accumulator 105.

Figure 6:
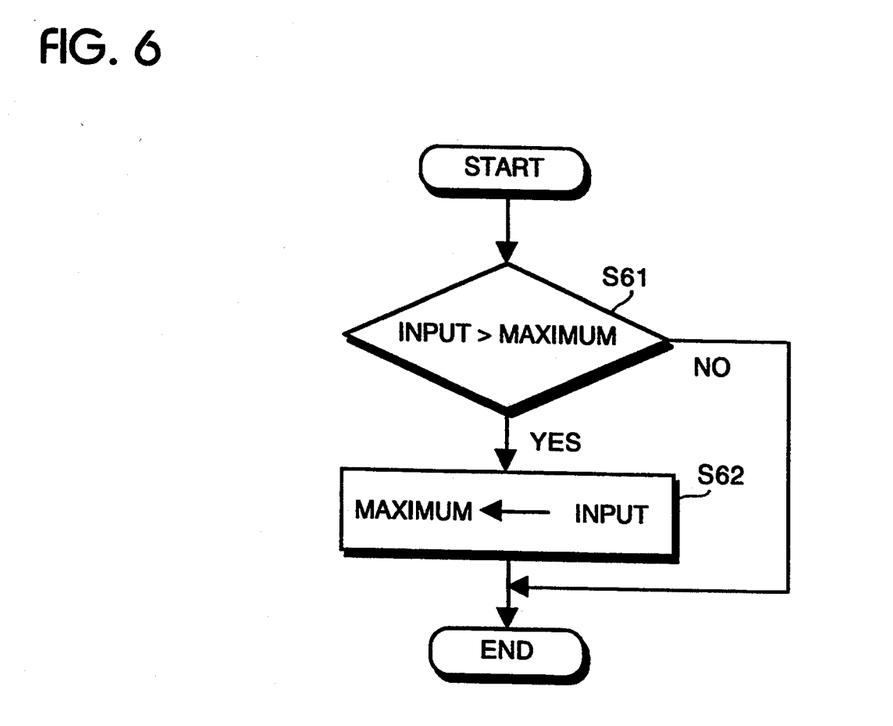
FIG. 6 is a flowchart showing the operation of an amplitude calculating circuit of the sound gain control device according to the present invention.

Next, referring to FIG. 6, the processing corresponding to the arithmetic processing by the amplitude calculating circuit 42 will be described. When a program for the amplitude calculation stored in the ROM 101 starts, the ALU 100 judges whether the input level x is larger than the default value, at step S61. When it is larger than the default value, the input level x is set as the maximum value at step S62. On the other hand, when the input level x is judged not to be larger than the default value at step S61 this cycle of the processing terminates without setting a new maximum value. This processing is repeated for a plurality of input levels successively input to the amplitude calculating circuit 42 from the non-linear conversion circuit 41, thereby to obtain the maximum value of the input levels (outputs from the non-linear conversion circuit 41) in each prescribed period. In this example, the maximum value of the input levels is calculated to obtain an "amplitude" in the prescribed period. However, it is possible to obtain the amplitude in other various methods using the multiplication function provided to the DSP. For example, it is possible to filter the input level so that the noise level is not added for the calculation for the amplitude, thereby to eliminate noises from the input level at the calculation of the amplitude.

As described above, the amplitude and the time axis of a signal with a small amplitude included in the sound can be enlarged by the non-linear conversion circuit, so as to average the incidence probability of amplitudes of sound signals. By this averaging, noises with large amplitudes can be compressed. Therefore, when the gain control is performed based on the averaged sound signals, a proper gain control with little influence of noises and intonation can be achieved.

Example 2

Figure 7:
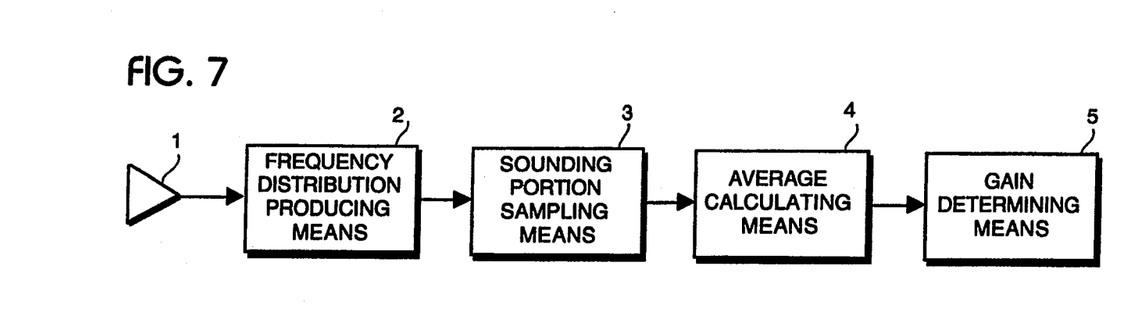
FIG. 7 shows a structure of another sound gain control device according to the present invention.

FIG. 7 shows a structure of a sound gain control device according to the present invention.

When sound signals are input through a sound input device 1, first, a frequency distribution of amplitudes of the sound signals in each prescribed period is produced by a frequency distribution producing means 2. The frequency distribution of amplitudes is a histogram produced by fractionating each prescribed period into blocks of sound signals for a sampling, quantizing the amplitudes of the block of sound signals in each sampling time, and counting the number of blocks having the same level of quantized values.

Then, a sounding portion sampling means 3 samples only the sounding portions of the sound signals from the frequency distribution of amplitudes of the sound signal produced by the frequency distribution producing means 2. Since the frequency distribution shows the frequency of each amplitude level of the sound signals in a prescribed period, the frequency distribution of only the sounding portions can be sampled by omitting the frequencies of the amplitudes below a certain level.

Subsequently, an average calculating means 4 calculates an average of the amplitudes based on the frequency distribution of only the sounding portions. Then, a gain determining means (gain coefficient calculating means) 5 determines a gain based on the average of the amplitudes. Therefore, if the level of the sounding portions of the sound signals is uniform, the averages of the amplitude levels are unified regardless of the amount of the silent portions, and thus the gain determination only based on the sounding portions is possible.

As a result, according to the sound gain control device of this example, an optimal gain control is possible at any time without being affected by the silent portions of the sound signals.

Figure 8:
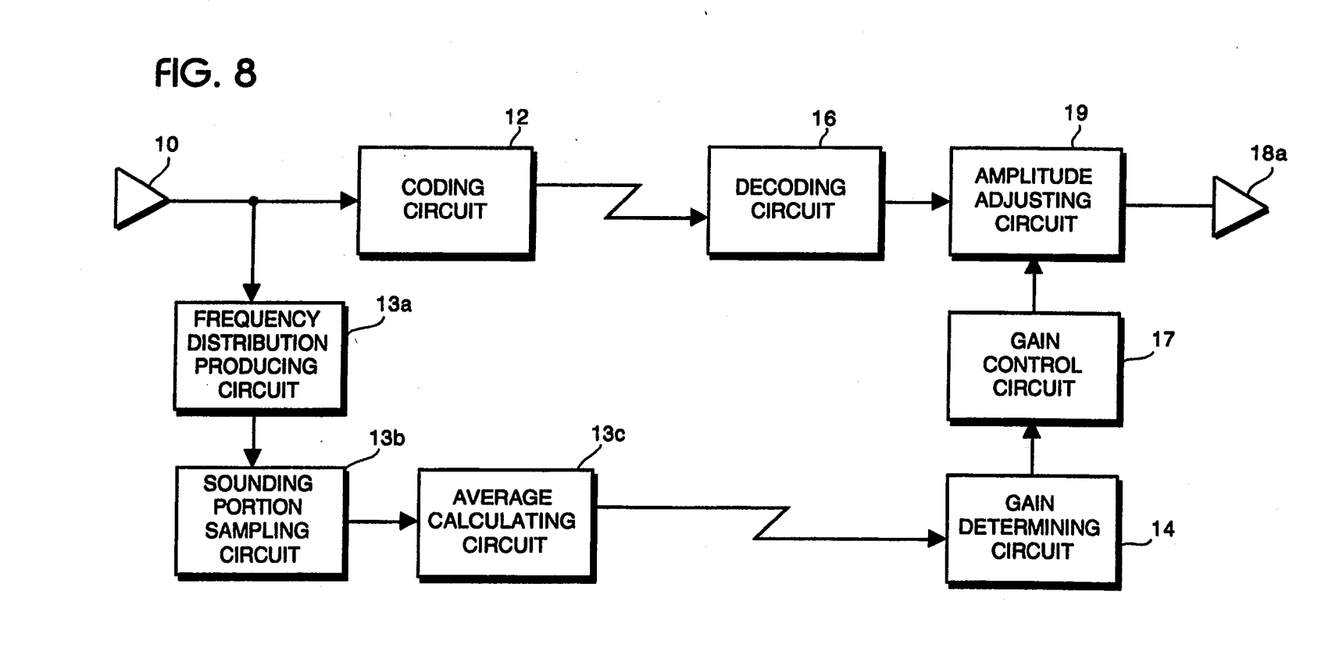
FIG. 8 shows a structure of a sound recording/reproducing device provided with the sound gain control device of FIG. 7.

FIG. 8 shows a structure of a sound recording/reproducing device provided with the sound gain control device of this example. Sound signals input through a sound input device 10 are sent to a coding circuit 12 and a frequency distribution producing circuit 13a. The coding circuit 12 can be a circuit for converting sound signals into digital data by a conventional PCM (pulse code modulation) method. Preferably, however, it is a circuit capable of compressing coded data by a method such as ADPCM (adaptive differential PCM). The digital data coded by the coding circuit 12 are later decoded by a decoding circuit 16. The decoding circuit 16 decodes the digital data coded by the coding circuit 12 to the sound signals by the reverse conversion of the same method as that employed by the coding circuit 12. The sound signals decoded by the decoding circuit 16 are then sent to a sound output device 18a to be reproduced as the sound. The sound CODEC of this example comprises the coding circuit 12 and the decoding circuit 16.

The frequency distribution producing circuit 13a samples and quantizes the input sound signals, and produces a frequency distribution of amplitudes of the quantized sound signals in each prescribed period including a certain number of sampling times. The frequency distribution is a histogram produced by counting the number of sampling times having the same amplitude level of the quantized sound signals.

The output of the frequency distribution producing circuit 13a is connected to a sounding portion sampling circuit 13b. The sounding portion sampling circuit 13b samples only the sounding portions of the sound signals from the frequency distribution produced by the frequency distribution producing circuit 13a.

The output of the sounding portion sampling circuit 13b is connected to an average calculating circuit 13c. The average calculating circuit 13c calculates an average of the amplitude levels in each period including a certain number of sampling times. Based on the average of the amplitude levels calculated by the average calculating circuit 13c, a gain of the sound signals is later determined by a gain determining circuit 14.

The output of the gain determining circuit 14 is connected to an amplitude adjusting circuit 19 through a gain control circuit 17. The gain control circuit 17 controls the amplitude adjusting circuit 19 based on the gain determined by the gain determining circuit 14, and thus adjusts the gain of the sound signals decoded by the decoding circuit 16.

It is possible to use the frequency distribution producing circuit 13a, the sounding portion sampling circuit 13b, and the average calculating circuit 13c as the amplitude calculating circuit 42 in Example 1 shown in FIG. 1.

The operation of the sound recording/reproducing device provided with the sound gain control of the above structure will be described.

Sound signals input through the sound input device 10 are sent to the coding circuit 12 and the frequency distribution producing circuit 13a. The sound signals sent to the coding circuit 12 are coded to digital data by the ADPCM method, etc., and are temporarily stored in a semiconductor memory (not shown) at appropriate intervals.

The sound signals sent to the frequency distribution producing circuit 13a are sampled so as to produce a frequency distribution of amplitudes of the sound signals in each period including a certain number of sampling times. Then, the frequency distribution is sent to the sounding portion sampling circuit 13b so as to sample only the sounding portions of the sound signals. Since the frequency distribution shows the frequency of every amplitude level of the sound signals within the prescribed period, it is possible to produce a frequency distribution showing only the frequencies of sounding portions by omitting the frequencies of amplitudes below a certain level. The frequency distribution sampling only the sounding portions is then sent to the average calculating circuit 13c so as to calculate an average of the amplitude levels, which is temporarily stored in a semiconductor memory (not shown) at appropriate intervals. In this way, if the sounding portions of the sound signals are uniform, the averages of amplitude levels are unified regardless of the occupying rate of silent portions in the sound signals.

The digital data stored in the semiconductor memory are sequentially read out to be decoded into sound signals by the decoding circuit 16. The decoded sound signals are then sent to the sound output device 18a through the amplitude adjusting circuit 19 to be reproduced as the sound.

The data of the averages stored in the semiconductor memory are read out one by one whenever the digital data corresponding to the prescribed number of samplings are read out from the semiconductor memory and sent to the gain determining circuit 14. The gain determining circuit 14 determines the gain based on the data of the averages of the amplitude levels, and sends the gain to the gain control circuit 17, which adjusts the gain of the sound signals passing through the amplitude adjusting circuit 19.

AS a result, an optimal gain control based on only sounding portions in the original speech is possible at any time without being affected by the amount of the silent portions therein. Thus, the sound properly gain-adjusted is reproduced from the sound output device 18a.

Example 3

Figure 9:
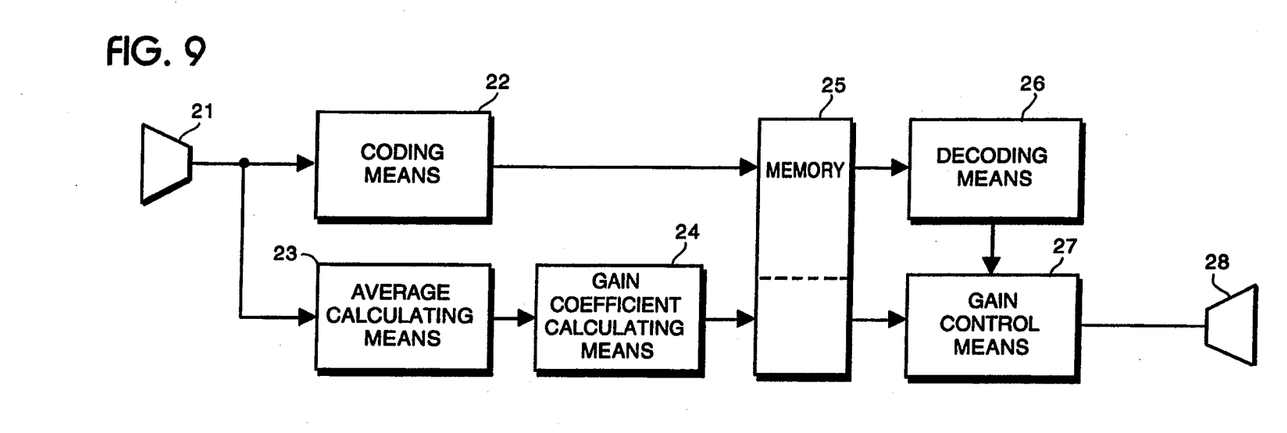
FIG. 9 shows a structure of yet another sound gain control device according to the present invention.

FIG. 9 shows a structure of a sound recording/reproduction device according to the present invention.

The sound signals input through a sound input device 21 are coded after compression if required. Also, the sound signals are sent to an average calculating means 23 so as to calculate an average of amplitudes of the sound signals in each prescribed period, and then sent to a gain coefficient calculating means 24 so as to calculate a gain coefficient. The gain coefficient calculated is then stored in a semiconductor memory 25 together with the digital data in the prescribed period.

For reproducing the sound signals, first, the digital data are read from the semiconductor memory 25 and decoded by a decoding means 26. At this time, a gain control means 27 reads the data of gain coefficients from the semiconductor memory 25 one by one whenever the digital data in the prescribed period are decoded, and adjusts the gains of the decoded sound signals based on the corresponding gain coefficient.

As a result, according to the sound recording/reproducing device of this example, the gains of the sound signals can be adjusted as in conventional devices, and the adjusted sound signals are output from a sound output device 28, for example. Further, in this example, the gain coefficient is stable during the prescribed period, whereby the intonation of the sound during the period can be preserved to some extent and reproduced. Furthermore, the gain coefficient is produced once in the prescribed period, whereby the amount of digital data of the sound signals will not be so widely increased when the data of the gain coefficient are added thereto. Also, if the gain coefficient is compulsively set to a fixed value at the gain control means 27, the sound with the same amplitudes and intonation as the original sound can be reproduced.

Figure 10:
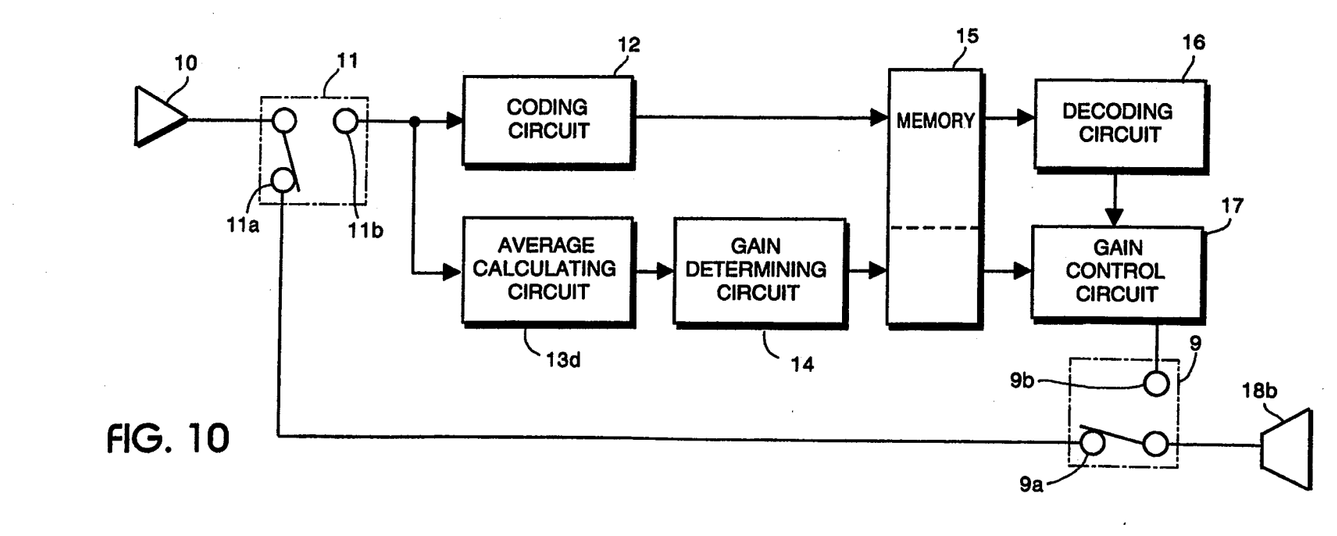
FIG. 10 is a block diagram showing a structure of a sound recording/reproducing device according to the present invention used for the telephone with an answering function.

FIG. 10 is a block diagram showing a structure of the sound recording/reproducing device of this example when it is used for a telephone with the answering function.

The sound signals input through a sound input device 10 (telephone line) are sent to either of two circuits by a switch 11 having two contacts 11a and 11b. One circuit starting at the contact 11a of the switch 11 is connected to a receiver 18b through a contact 9a of a switch 9. The other circuit starting at the contact 11b of the switch 11 is branched into two to be connected to a coding circuit 12 and an average calculating circuit 13d, respectively.

The coding circuit 12 can be a circuit for converting sound signals into digital data by the conventional PCM method. Preferably, however, it is a circuit capable of compressing coded data to realize a long-time recording by a method such as ADPCM. The digital data coded by the coding circuit 12 are sequentially stored in a semiconductor memory 15, and the stored digital data are sequentially read by a decoding circuit 16. The decoding circuit 16 decodes the coded digital data by the coding circuit 12 to the sound signals by the reverse conversion of the same method as that employed by the coding circuit 12.

The average calculating circuit 13d samples the input sound signals and calculates an average of amplitudes of the sound signals in each prescribed period including a certain number of sampling times. This sampling of the sound signals can be performed at one time with the sampling in the coding circuit 12. The average of amplitudes of the sound signals calculated by the average calculating circuit 13d is sent to a gain determining circuit 14. The gain determining circuit 14 compares the average calculated by the average calculating circuit 13d with a prescribed standard amplitude, so as to calculate a gain coefficient based on the comparison. The gain coefficient calculated by the gain determining circuit 14 is stored in another area of the semiconductor memory 15. Only one gain coefficient is produced for a plurality of samplings, whereby the space occupied by the data of the gain coefficient in the memory is quite small, compared with that occupied by the digital data from the coding circuit 12.

The gain coefficient stored in the semiconductor memory 15 is read by a gain control circuit 17. The gain control circuit 17 adjusts the gains of the sound signals to be reproduced by multiplying the sound signals sent from the decoding circuit 16 by the gain coefficient read every prescribed period from the semiconductor memory 15. The output from the gain control circuit 17 is also connected to the receiver 18b through a contact 9b of the switch 9.

The operation of the sound recording/reproducing device of the above structure will be described.

In the normal communication, the switch 11 is turned to the contact 11a and the switch 9 is turned to the contact 9a. Therefore, the sound signals from the telephone line 10 are directly sent to the receiver 18b so as to enable the normal communication through the telephone.

When the answering function of the telephone is operative, the switch 11 is turned to the contact 11b, allowing the sound signals through the telephone line 10 to be sent to the coding circuit 12 and the average calculating circuit 13d.

The sound signals sent to the coding circuit 12 are coded to digital signals by the ADPCM method, etc., and sequentially stored in the semiconductor memory 15. On the other hand, the sound signals sent to the average calculating circuit 13d are used to calculate an average of amplitudes thereof in each period including a certain number of sampling times. The average obtained is then sent to the gain determining circuit 14 to be compared with a prescribed standard amplitude. Based on the rate obtained by this comparison, the gain coefficient is calculated and stored in another area of the semiconductor memory 15.

When the message stored in the semiconductor memory 15 is reproduced, the switch 9 is turned to the contact 9b. Then, the decoding circuit 16 sequentially reads the digital data from the semiconductor memory 15 and decodes them to the sound signals. At this time, the gain control circuit 17 reads the gain coefficient from the semiconductor memory 15 every prescribed period including the decoded sound signals and adjusts the gain by multiplying the sound signals in each prescribed period by the gain coefficient. Thus, the gain-adjusted sound signals are output to the receiver 18b through the switch 9. In this case, the gain coefficient is stable during each period including a plurality of sampling times, whereby the intonation of the sound during each period can be preserved to some extent.

When it is desired to reproduce the message without the gain control processing, the gain efficient is set to a fixed value without reading the calculated gain efficient stored in the semiconductor memory 15. Thereby, the sound signals decoded by the decoding circuit 16 can be reproduced preserving the amplitude and intonation of the original sound.

Instead of the average calculating circuit 13d, the device may include the frequency distribution producing circuit 13a, the sounding portion sampling circuit 13b, and the average calculating circuit 13c as shown in FIG. 8.

As described above, the sound gain control device of the present invention performs the non-linear conversion for averaging the incidence probability of amplitudes of sound signals, determines an amplitude required for the gain control based on the averaged signals, and effects the gain control of the sound signals based on the gain corresponding to the determined amplitude. Therefore, the adverse effects of the noises and intonation can be prevented, and thus the reliability of the gain control is improved. When the sound gain control device of the present invention is applied to a sound recording/reproducing device provided with a sound CODEC, the sound quality is remarkably improved.

Also, according to the present invention, an optimal gain control is possible at any time since the gain control is performed based on only the sounding portions of the sound signals regardless of the amount of silent portions in the sound signals.

Further, according to the present invention, the sound can be reproduced preserving the original amplitudes and intonation, while minimizing the increase of additional recording data.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing one or more of the features of patentable novelty that reside in the present invention, including all the features that would be treated as equivalents thereof by those skilled in the art to which this invention pertains.

What is claimed is:

1. A sound gain control device for automatically determining a gain comprising:
   a non-linear conversion means for receiving sound signals from a sound input device and non-linearly converting said sound signals so as to average the incidence probabilities of said sound signals;
   an amplitude calculating means for receiving said non-linearly converted sound signals and calculating an amplitude of said non-linearly converted sound signals; and
   a gain determining means for determining a gain based on said calculated amplitude of said non-linearly converted sound signals, an amplitude of an output signal from a sound CODEC being multiplied by said determined gain for controlling the amplitude of the output signal.

2. A sound gain control device according to claim 1, said device further comprising a digital signal processor having an arithmetic processor, said arithmetic processor conducting a non-linear conversion according to a software program in said digital signal processor.

3. A sound gain control device according to claim 2, wherein said non-linear conversion is conducted by a $\mu$ law compression characteristic method which is one of non-linear quantization methods.

4. A sound gain control device for automatically controlling a gain by which an output signal from a sound CODEC is multiplied, said device comprising:
   a frequency distribution producing means for producing a first frequency distribution of amplitudes of sound signals in each prescribed period, a non-linear conversion being conducted on said sound signals so as to average the incidence probabilities of said sound signals;
   a sounding section sampling means for sampling only sounding sections of said sound signals out of said first frequency distribution, and for producing a second frequency distribution of amplitudes of said sound signals;
   an average calculating means for calculating an average of amplitudes of said sound signals based on said second frequency distribution; and
   a gain determining means for determining said gain based on said calculated average of said amplitudes of said sound signals.

5. A sound recording/reproducing device comprising:
   a coding means for coding sound signals;

a memory means for recording said coded sound signals;

a decoding means for reading said coded sound signals from said memory means and decoding said coded sound signal;

an average calculating means for calculating an average of amplitudes of non-linearly converted sound signals in each period with non-linear conversion which averages incidence probabilities of said sound signals;

a gain coefficient calculating means for calculating a gain coefficient based on said calculated average of amplitudes of said sound signals and recording said gain coefficient to said memory means; and a gain control means for reading said gain coefficient corresponding to the coded sound signals from said memory means and adjusting gain based on said gain coefficient.

6. A sound gain control device according to claim 1, wherein in order to non-linearly convert said sound signals, amplitude and time axis of signals with smaller amplitudes among said sound signals are enlarged.

7. A sound gain control device according to claim 4, wherein said non-linear conversion is conducted by enlarging amplitude and time axis of signals with smaller amplitudes among said sound signals.

8. A sound recording/reproducing device according to claim 5, wherein said non-linear conversion is conducted by enlarging amplitude and time axis of signals with smaller amplitudes among said sound signals.

* * * * *